(12) United States Patent
Chen et al.

(10) Patent No.: US 10,343,405 B2
(45) Date of Patent: Jul. 9, 2019

(54) MANUFACTURING METHOD OF FLUID CONTROL DEVICE

(71) Applicant: Microjet Technology Co., Ltd., Hsinchu (TW)

(72) Inventors: Shih-Chang Chen, Hsinchu (TW); Ying-Lun Chang, Hsinchu (TW); Hsiang-Dyi Wu, Hsinchu (TW); Chi-Feng Huang, Hsinchu (TW); Yung-Lung Han, Hsinchu (TW); Jia-Yu Liao, Hsinchu (TW); Jheng-Wei Chen, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 80 days.

(21) Appl. No.: 15/641,054

(22) Filed: Jul. 3, 2017

(65) Prior Publication Data

US 2018/0065370 A1      Mar. 8, 2018

(30) Foreign Application Priority Data

Sep. 5, 2016   (TW) .............................. 105128594 A

(51) Int. Cl.
  *B29C 53/04*   (2006.01)
  *F04B 17/00*   (2006.01)
  (Continued)

(52) U.S. Cl.
  CPC .............. *B41J 2/1623* (2013.01); *B29C 53/04* (2013.01); *B29C 65/48* (2013.01); *B29C 69/00* (2013.01);
  (Continued)

(58) Field of Classification Search
  None
  See application file for complete search history.

(56) References Cited

U.S. PATENT DOCUMENTS

2013/0178752 A1*   7/2013   Kodama ............... A61B 5/0235
                                                           600/498
2013/0323085 A1*  12/2013   Hirata .................. F04B 43/043
                                                            417/44.2
2014/0377099 A1    12/2014   Hsueh et al.

FOREIGN PATENT DOCUMENTS

CN      102979703       3/2013
CN      102979704 A     3/2013
(Continued)

*Primary Examiner* — Barbara J Musser
(74) *Attorney, Agent, or Firm* — Birch, Stewart, Kolasch & Birch, LLP

(57) ABSTRACT

A manufacturing method of a fluid control device is provided. Firstly, a housing, a piezoelectric actuator and a deformable substrate are provided. The piezoelectric actuator includes a piezoelectric element and a vibration plate having a bulge. The deformable substrate includes a flexible plate and a communication plate. The flexible plate includes a movable part. Then, the flexible plate and the communication plate are stacked on and coupled with each other to form the deformable substrate. Then, the housing, the piezoelectric actuator and the deformable substrate are sequentially stacked on each other and coupled with each other. A synchronous deformation process is implemented by applying at least one external force to the deformable substrate, so that the flexible plate and the communication plate of the deformable substrate are subjected to a synchronous deformation, and a specified depth between the movable part and the bulge of the vibration plate is defined.

11 Claims, 12 Drawing Sheets

(51) Int. Cl.
  *F04B 43/04*   (2006.01)
  *H01L 41/23*   (2013.01)
  *H01L 41/25*   (2013.01)
  *B41J 2/16*    (2006.01)
  *B29C 65/48*   (2006.01)
  *B29C 69/00*   (2006.01)
  *B29L 31/00*   (2006.01)

(52) U.S. Cl.
  CPC ............. *B41J 2/161* (2013.01); *F04B 17/003* (2013.01); *F04B 43/046* (2013.01); *H01L 41/23* (2013.01); *H01L 41/25* (2013.01); *B29L 2031/7496* (2013.01); *B29L 2031/767* (2013.01)

(56) References Cited

FOREIGN PATENT DOCUMENTS

| | | |
|---|---|---|
| CN | 102979705 A | 3/2013 |
| CN | 103140166 | 6/2013 |
| CN | 104500374 | 4/2015 |
| CN | 103339380 | 11/2015 |
| CN | 205383064 U | 7/2016 |
| CN | 206092351 U | 4/2017 |
| EP | 3 109 472 A1 | 12/2016 |
| JP | 2013-57247 A | 3/2013 |
| JP | WO2013/054801 A1 | 4/2013 |
| JP | WO2013/187271 A1 | 12/2013 |
| JP | 2016053371 | 4/2016 |

\* cited by examiner

MANUFACTURING METHOD OF FLUID CONTROL DEVICE

FIELD OF THE INVENTION

The present invention relates to a manufacturing method of a fluid control device, and more particularly to a manufacturing method of a fluid control device with a deformable base.

BACKGROUND OF THE INVENTION

With the advancement of science and technology, fluid control devices are widely used in many sectors such as pharmaceutical industries, computer techniques, printing industries or energy industries. Moreover, the fluid control devices are developed toward elaboration and miniaturization. The fluid control devices are important components that are used in for example micro pumps, micro atomizers, printheads or industrial printers for transporting fluid. Therefore, it is important to provide an improved structure of the fluid control device.

FIG. 1A is a schematic cross-sectional view illustrating a portion of a conventional fluid control device. FIG. 1B is a schematic cross-sectional view illustrating an assembling shift condition of the conventional fluid control device. The main components of the conventional fluid control device 100 comprise a substrate 101 and a piezoelectric actuator 102. The substrate 101 and the piezoelectric actuator 102 are stacked on each other, assembled by any well known assembling means such as adhesive, and separated from each other by a gap 103. In an ideal situation, the gap 103 is maintained at a specified depth. More particularly, the gap 103 specifies the interval between an alignment central portion of the substrate 101 and a neighborhood of a central aperture of the piezoelectric actuator 102. In response to an applied voltage, the piezoelectric actuator 102 is subjected to deformation and a fluid is driven to flow through various chambers of the fluid control device 100. In such way, the purpose of transporting the fluid is achieved.

The piezoelectric actuator 102 and the substrate 101 of the fluid control device 100 are both flat-plate structures with certain rigidities. Thus, it is difficult to precisely align these two flat-plate structures to make the specified gap 103 and maintain it. If the gap 103 was not maintained in the specified depth, an assembling error would occur. Further explanation is exemplified as below. Referring to FIG. 1B, the piezoelectric actuator 102 is inclined at an angle θ by one side as a pivot. Most regions of the piezoelectric actuator 102 deviate from the expected horizontal position by an offset, and the offset of each point of the regions is correlated positively with its parallel distance to the pivot. In other words, slight deflection can cause a certain amount of deviation. As shown in FIG. 1B, one indicated region of the piezoelectric actuator 102 deviates from the standard by d while another indicated region can deviate by d'. As the fluid control device is developed toward miniaturization, miniature components are adopted. Consequently, the difficulty of maintaining the specified depth of the gap 103 has increased. The failure of maintaining the depth of the gap 103 causes several problems. For example, if the gap 103 is increased by d', the fluid transportation efficiency is reduced. On the other hand, if the gap 103 is decreased by d', the distance of the gap 103 is shortened and is unable to prevent the piezoelectric actuator 102 from readily being contacted or interfered by other components during operation. Under this circumstance, noise is generated, and the performance of the fluid control device is reduced.

Since the piezoelectric actuator 102 and the substrate 101 of the fluid control device 100 are flat-plate structures with certain rigidities, it is difficult to precisely align these two flat-plate structures. Especially when the sizes of the components are gradually decreased, the difficulty of precisely aligning the miniature components is largely enhanced. Under this circumstance, the performance of transferring the fluid is deteriorated, and the unpleasant noise is generated.

Therefore, there is a need of providing an improved fluid control device in order to eliminate the above drawbacks.

SUMMARY OF THE INVENTION

The present invention provides a fluid control device. The fluid control device has a miniature substrate and a miniature piezoelectric actuator. Since the substrate is deformable, a specified depth between a flexible plate of the substrate and a vibration plate of the piezoelectric actuator is maintained. Consequently, the assembling error is reduced, the efficiency of transferring the fluid is enhanced, and the noise is reduced. That is, the fluid control device of the present invention is more user-friendly.

In accordance with an aspect of the present invention, there is provided a manufacturing method of a fluid control device. Firstly, a housing, a piezoelectric actuator and a deformable substrate are provided. The piezoelectric actuator includes a piezoelectric element and a vibration plate. The deformable substrate includes a flexible plate and a communication plate. The vibration plate has a first surface and an opposing second surface. A bulge is formed on the second surface of the vibration plate. The communication plate has an outer surface. The flexible plate includes a movable part. Then, the flexible plate and the communication plate are stacked on each other and coupled to form the deformable substrate. Then, the housing, the piezoelectric actuator and the deformable substrate are sequentially stacked on each other and coupled for being combined with each other. A synchronous deformation process is implemented by applying at least one external force to the deformable substrate, so that the flexible plate and the communication plate of the deformable substrate are subjected to a synchronous deformation, and a specified depth between the movable part of the flexible plate and the bulge of the vibration plate is defined.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides a manufacturing method of a fluid control device. The fluid control device can be used in many sectors such as pharmaceutical industries, energy industries computer techniques or printing industries for transporting fluids.

Figure 1A:
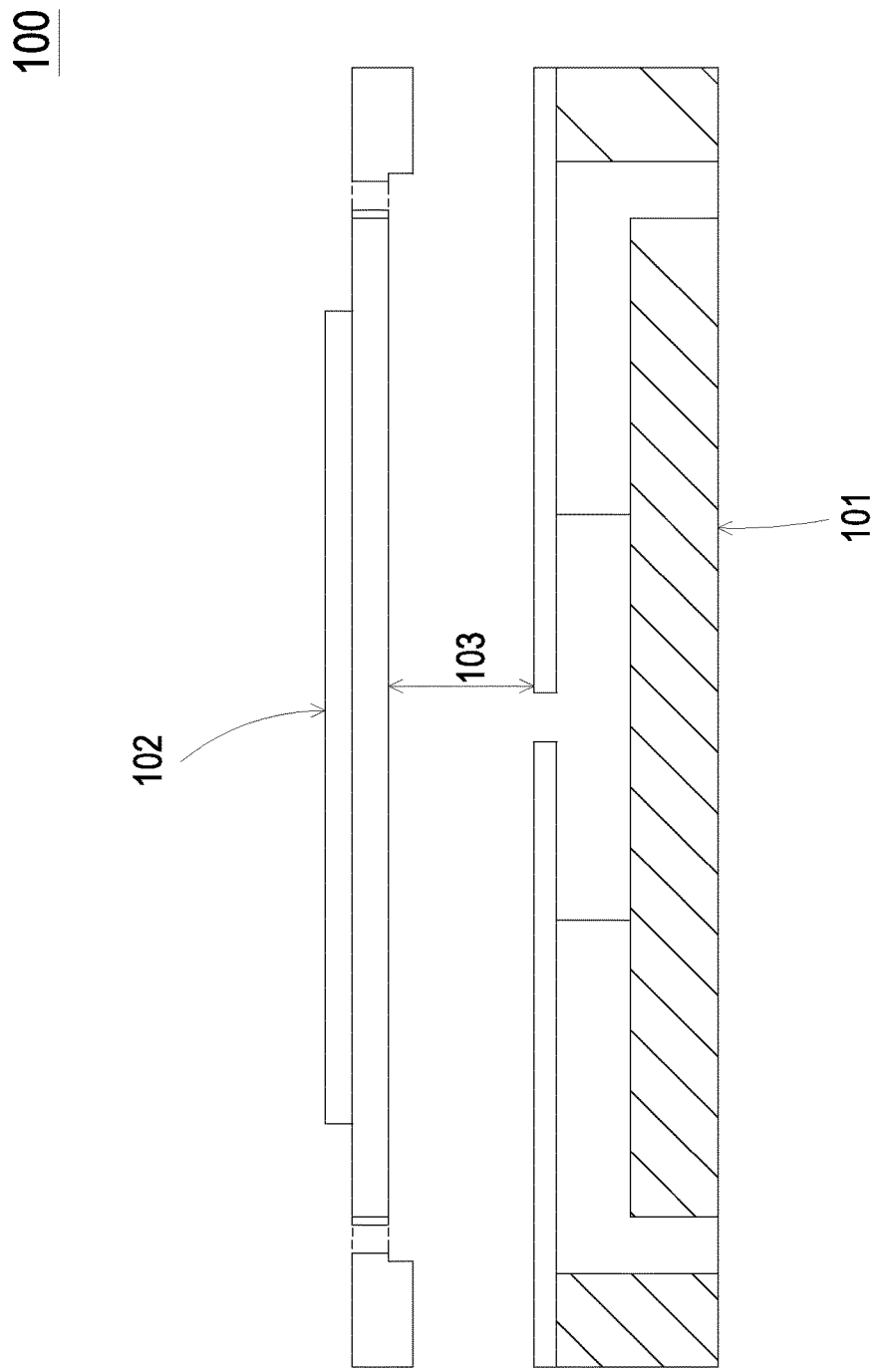
FIG. 1A is a schematic cross-sectional view illustrating a portion of a conventional fluid control device.
Figure 1B:
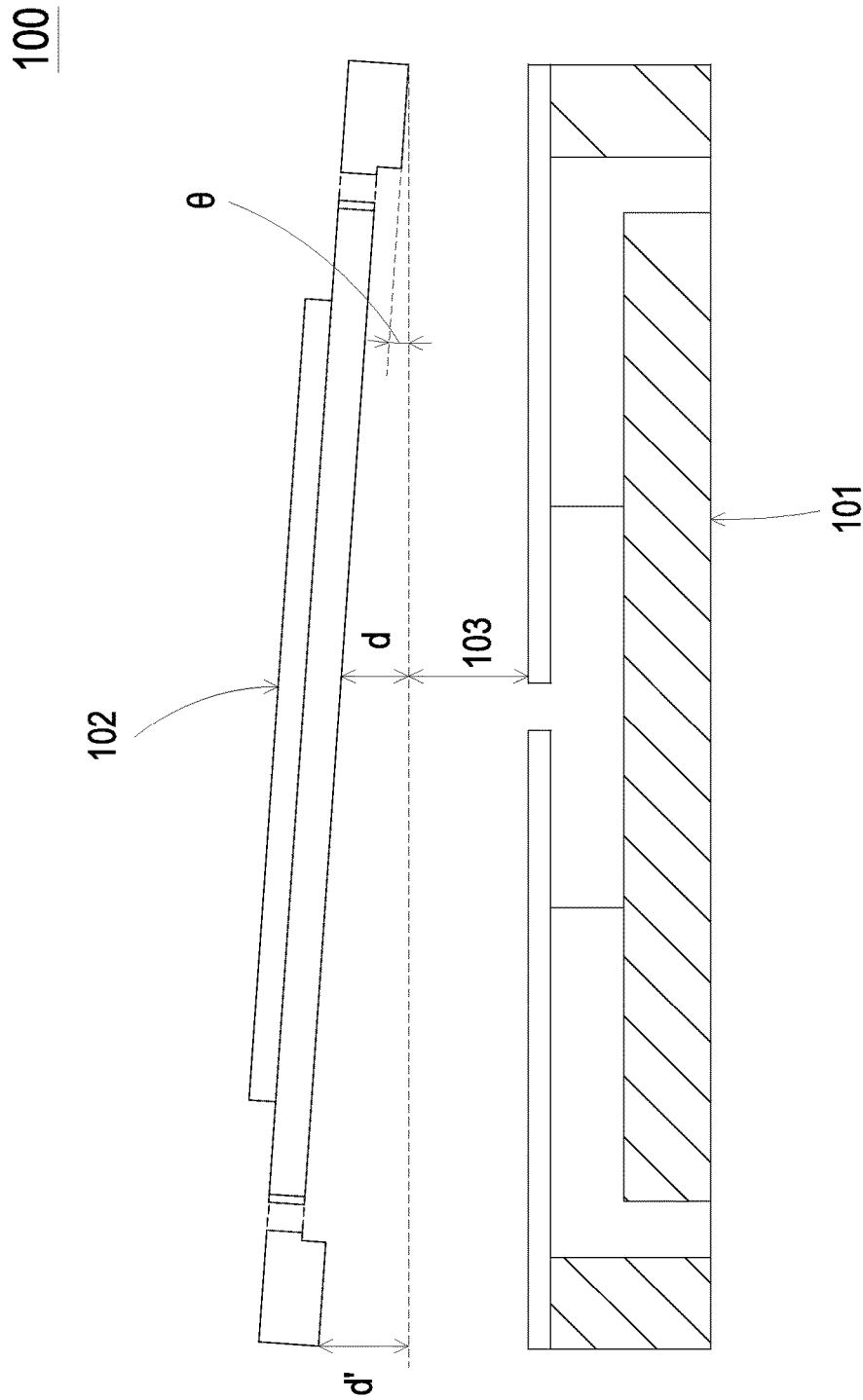
FIG. 1B is a schematic cross-sectional view illustrating an assembling shift condition of the conventional fluid control device.
Figure 2:
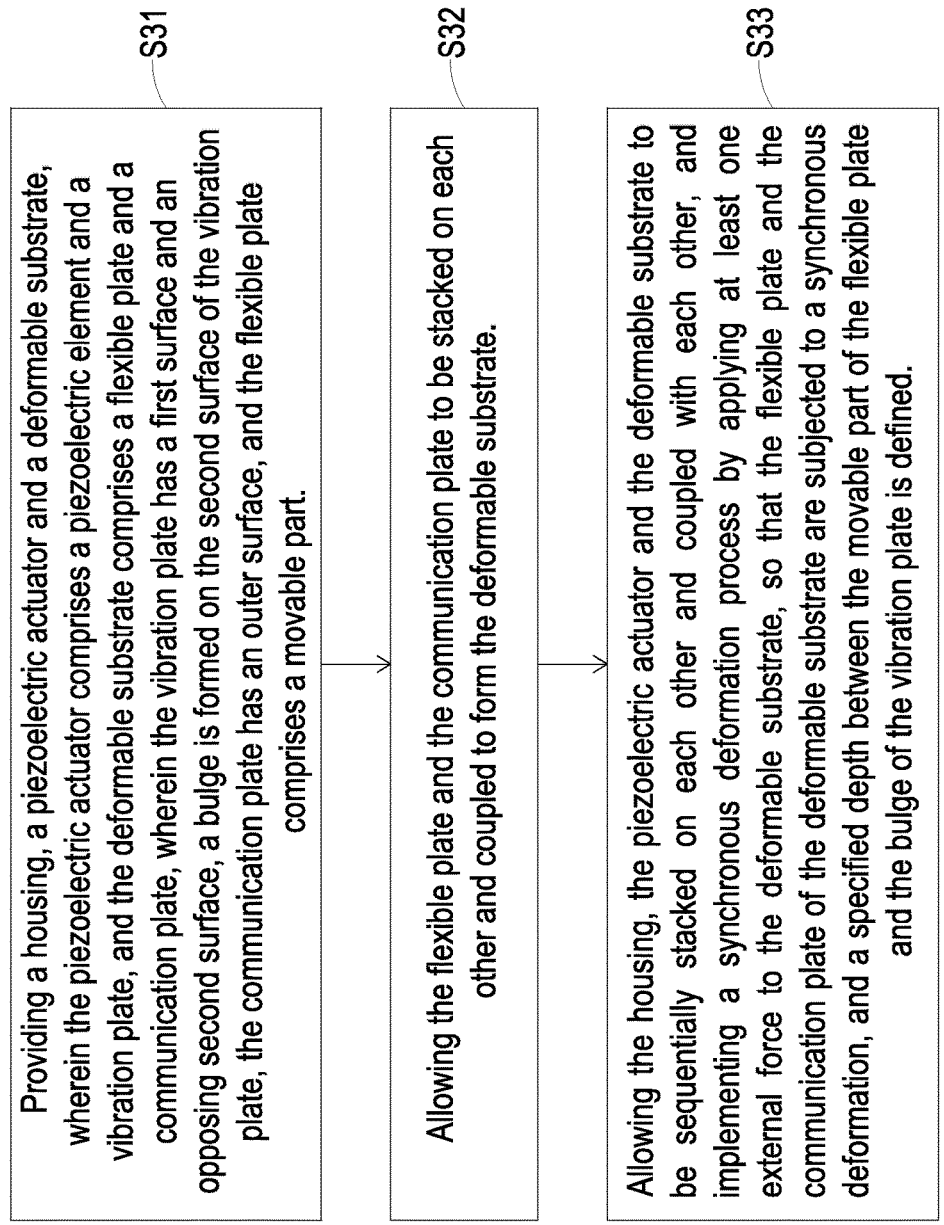
FIG. 2 is a flowchart illustrating a manufacturing method of a fluid control device according to an embodiment of the present invention.
Figure 3A:
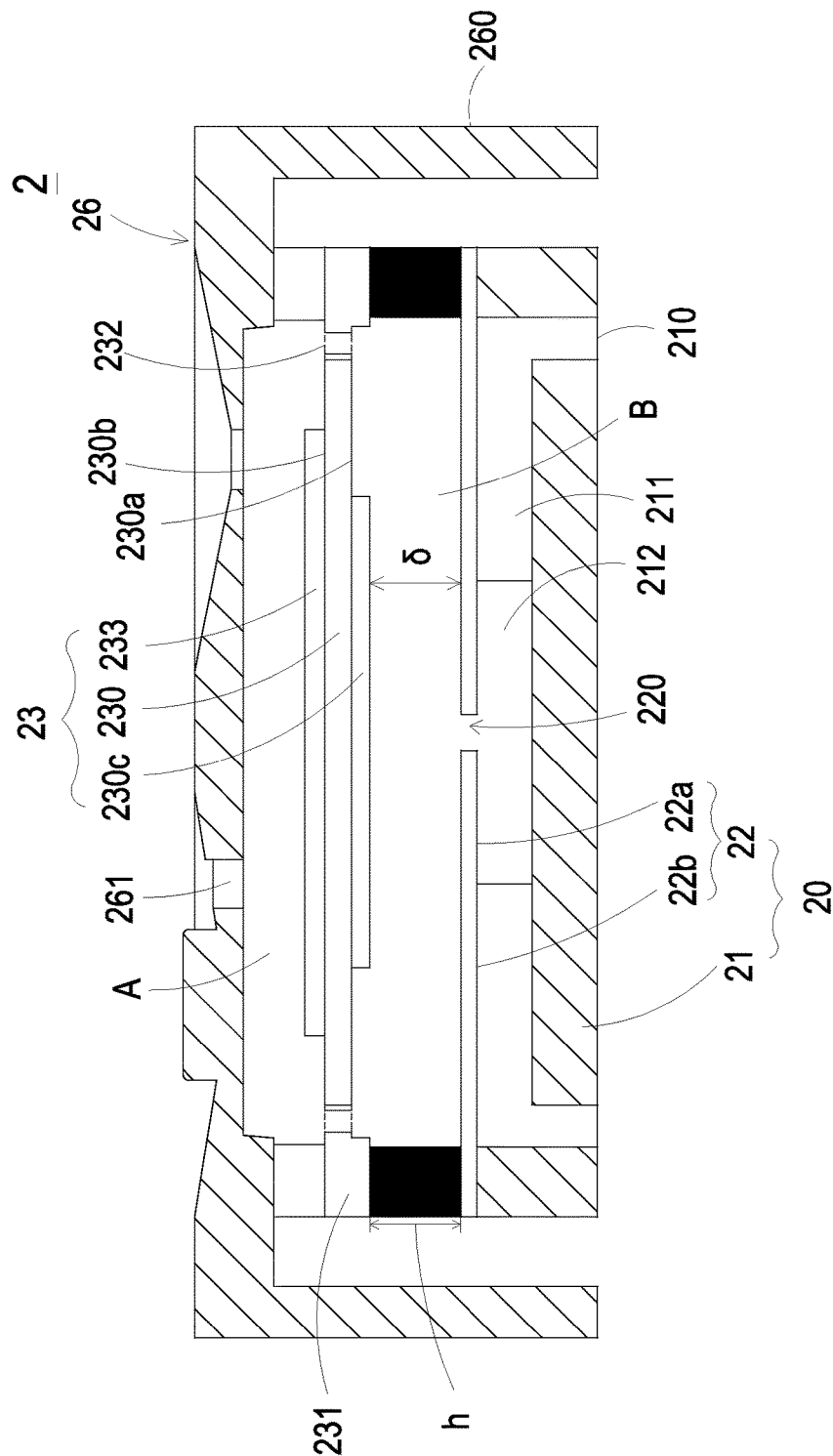
FIG. 3A is a schematic cross-sectional view of the fluid control device according to an embodiment of the present invention.

FIG. 2 is a flowchart illustrating a manufacturing method of a fluid control device according to an embodiment of the present invention. FIG. 3A is a schematic cross-sectional view of the fluid control device according to an embodiment of the present invention. Please refer to FIGS. 2 and 3A. In a step S31, a housing 26, a piezoelectric actuator 23 and a deformable substrate 20 are provided. The piezoelectric actuator 23 comprises a vibration plate 230 and a piezoelectric element 233. The vibration plate 230 has a first surface 230b and an opposing second surface 230a. Moreover, a bulge 230c is formed on the second surface 230a of the vibration plate 230. In this embodiment, the vibration plate 230 has a square flexible film structure. The piezoelectric element 233 has a square shape. The side length of the piezoelectric element 233 is not larger than the side length of the vibration plate 230. Moreover, the piezoelectric element 233 is attached on the first surface 230b of the vibration plate 230. By applying a voltage to the piezoelectric element 233, the piezoelectric element 233 is subjected to deformation to result in curvy vibration of the vibration plate 230. The piezoelectric actuator 23 further comprises an outer frame 231 and at least one bracket 232. The vibration plate 230 is enclosed by the outer frame 231. The profile of the outer frame 231 matches the profile of the vibration plate 230. That is, the outer frame 231 is a square hollow frame. Moreover, the at least one bracket 232 is connected between the vibration plate 230 and the outer frame 231 for elastically supporting the vibration plate 230. The deformable substrate 20 comprises a communication plate 21 and a flexible plate 22. The communication plate 21 has an outer surface 21a. The communication plate 21 comprises at least one inlet 210, at least one convergence channel 211 and a central cavity 212. The inlet 210 runs through the communication plate 21. A first end of the convergence channel 211 is in communication with the inlet 210, while a second end of the convergence channel 211 is in communication with the central cavity 212. The flexible plate 22 comprises a movable part 22a and a fixed part 22b. The fixed part 22b is fixed on the communication plate 21 in order to connect the flexible plate 22 with the communication plate 21. The movable part 22a is aligned with the central cavity 212. A central aperture 220 is formed within the movable part 22a and aligned with the central cavity 212 of the communication plate 21. The housing 26 comprises at least one outlet 261. Furthermore, the housing 26 can be a single plate or a frame consists of a bottom plate and a sidewall structure 260. The sidewall structure 260 extends from the peripheral of the bottom plate. An accommodation space is defined by the bottom plate and the sidewall structure 260 collaboratively. The piezoelectric actuator 23 is disposed within the accommodation space. The piezoelectric actuator 23 and the deformable substrate 20 are covered by the housing 26. In addition, a temporary storage chamber A is formed between the housing 26 and the piezoelectric actuator 23 for temporarily storing the fluid. The outlet 261 is in communication with the temporary storage chamber A. Consequently, the fluid can be discharged to exterior of the housing 26 from interior of the housing 26 through the outlet 261.

In a step S32, the flexible plate 22 and the communication plate 21 are stacked on each other and coupled with each other in order to form the deformable substrate 20.

In a step S33, the housing 26, the piezoelectric actuator 23 and the deformable substrate 20 are sequentially stacked on each other and coupled with each other to be combined. A synchronous deformation process is implemented by applying at least one external force to an outer portion of the deformable substrate 20, wherein the outer portion may be at least one surface of the flexible plate 22 or at least one surface of the communication plate 21. As a consequence, a synchronously-deformed structure is defined by the flexible plate 22 and the communication plate 21 collaboratively, and a specified depth δ is defined between the movable part 22a of the flexible plate 22 and the bulge 230c of the vibration plate 230. In this step, the piezoelectric actuator 23 is covered by the housing 26 (see FIG. 3A).

Please refer to FIG. 3A. The deformable substrate 20 shown in FIG. 3A has not been subjected to the synchronous deformation, while FIG. 3A is used for describing the stacked structure of the fluid control device 2. After the piezoelectric actuator 23 is received within an accommodation space 26a of the housing 26, the deformable substrate 20 is combined with the piezoelectric actuator 23 and collectively received within the accommodation space 26a, therefore sealing the bottom of the piezoelectric actuator 23. In the process of assembling, the movable part 22a of the flexible plate 22 and the bulge 230c of the piezoelectric actuator 23 are aligned. Moreover, after the synchronous deformation process is implemented, the deformable substrate 20 is bent in the direction toward or away the bulge 230c of the vibration plate 230 (see FIGS. 4 to 7).

The synchronous deformation process can involve or not involve an external force. In the former case, one or more external force is applied to the outer portion of the deformable substrate 20, which is more specifically the outer surface 21a of the communication plate 21, and thus synchronously deforms the flexible plate 22 and the communication plate 21 of the deformable substrate 20. Preferably but not exclusively, the external force is a contact force, which is applied directly upon the outer surface 21a of the communication plate 21 in a direction toward the flexible plate 22 to initiate the synchronous deformation. In addition, a force-exerting mark is formed on the contact outer surface 21a of the deformable substrate 20. The force-exerting mark may be an indentation or a concave caused in the process of stamping.

The external force also can be a non-contact force, including but not limited to a suction force generated by a vacuum aspirator, or a magnetic attraction force. While such non-contact force is being applied to the surface 26a of the communication plate 21 of the deformable substrate 20, the non-contact force does not contact the outer surface 21a, being separated it from an operation gap. That is, the non-contact force maintains a specific distance from the outer portion of the deformable substrate 20. The non-contact force is applied to the outer surface 21a in a direction away from the flexible plate 22 so as to synchronously deform the flexible plate 22 and the communication plate 21 of the deformable substrate 20. In addition, a force-exerting mark is formed on the outer surface 21a of the deformable substrate 20. The force-exerting mark may be an indentation or a concave. As a consequence, the specified depth δ is defined between the movable part 22a of the flexible plate 22 and the bulge 230c of the vibration plate 230, and the fluid control device 2 is produced.

Figure 3B:
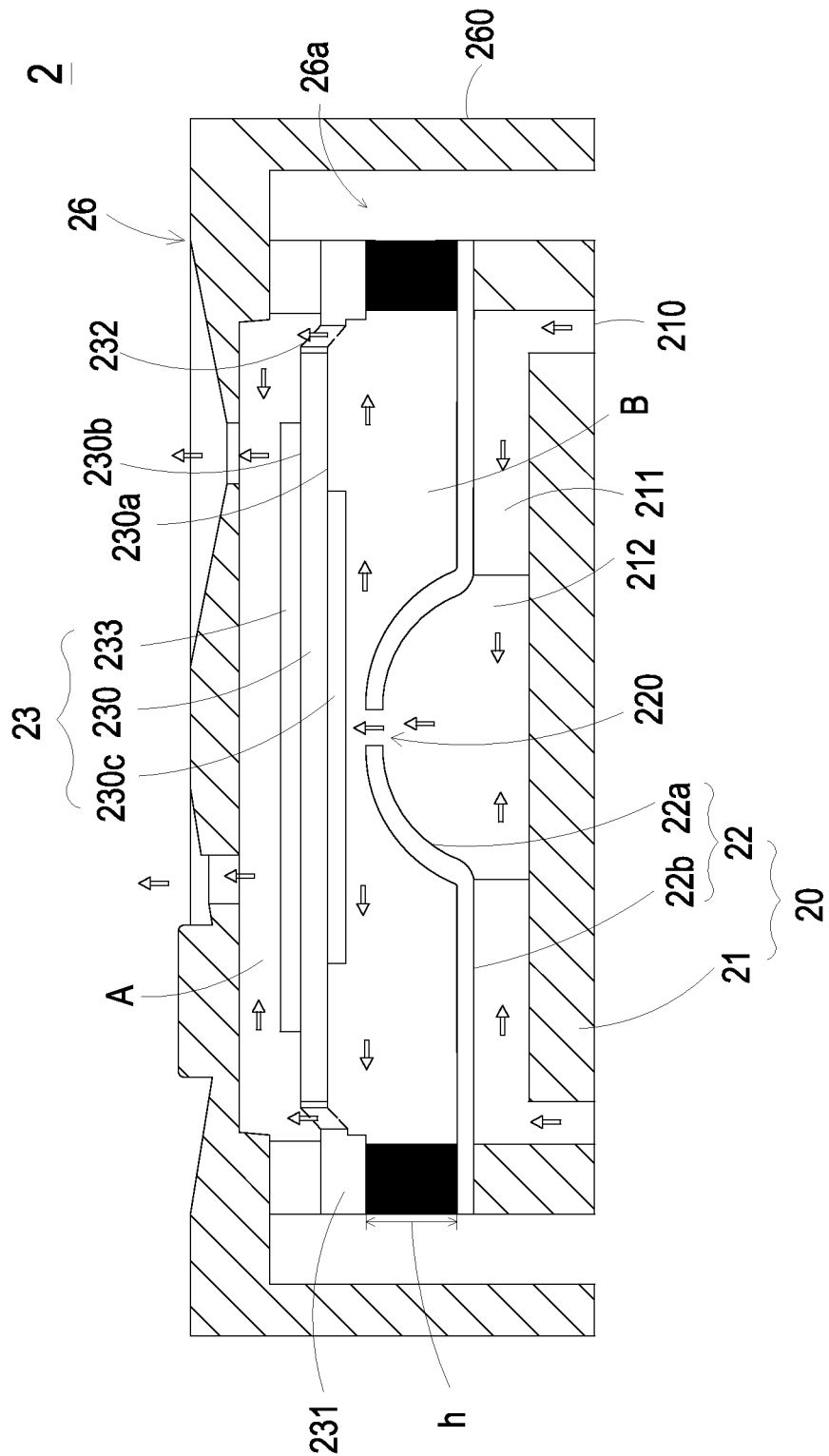
FIG. 3B is a schematic cross-sectional view illustrating the action of the fluid control device of FIG. 3A.

FIG. 3B is a schematic cross-sectional view illustrating the action of the fluid control device of FIG. 3A. Please refer to FIGS. 3A and 3B. After the communication plate 21, the flexible plate 22 and the piezoelectric actuator 23 are coupled and combined together, a convergence chamber is defined by partial flexible plate 22 including the central aperture 220 within, and the central cavity 212 of the communication plate 21 collaboratively. There is a gap h between the flexible plate 22 and the outer frame 231 of the piezoelectric actuator 23. Preferably but not exclusively, a medium (e.g., a conductive adhesive) is filled in the gap h. Consequently, the flexible plate 22 and the outer frame 231 of the piezoelectric actuator 23 are connected with each other through the medium. At the same time, the specified depth δ is defined between the movable part 22a of the flexible plate 22 and the bulge 230c of the piezoelectric actuator 23. When the vibration plate 230 of the piezoelectric actuator 23 vibrates, the fluid in a compressible chamber B defined between the flexible plate 22 and the piezoelectric actuator 23 is compressed, while the specified depth δ reduces due to the transformation of the flexible plate 22. Consequently, the pressure and the flow rate of the fluid are increased. The specified depth δ is a proper distance that is sufficient to reduce the contact interference between the movable part 22a of the flexible plate 22 and the bulge 230c of the piezoelectric actuator 23, thus reducing the noise generation. Moreover, the convergence chamber defined by the flexible plate 22 and the central cavity 212 of the communication plate 21 is in communication with the compressible chamber B through the central aperture 220.

When the fluid control device 2 is enabled, the piezoelectric element 233 of the piezoelectric actuator 23 is actuated in response to an applied voltage. Consequently, the vibration plate 230 of the piezoelectric actuator 23 vibrates along a vertical direction in a reciprocating manner. When the vibration plate 230 vibrates upwardly in response to the applied voltage, since the flexible plate 22 is light and thin, the flexible plate 22 vibrates simultaneously because of the resonance of the vibration plate 230. More especially, the movable part 22a of the flexible plate 22 is subjected to a curvy deformation. The central aperture 220 is located near or located at the center of the flexible plate 22. Since the vibration plate 230 vibrates upwardly, the movable part 22a of the flexible plate 22 is correspondingly moves upwardly, making an external fluid introduced by the at least one inlet 210, through the at least one convergence channel 211, into the convergence chamber. After that, the fluid is transferred upwardly to the compressible chamber B through the central aperture 220 of the flexible plate 22. As the flexible plate 22 is subjected to deformation, the volume of the compressible chamber B is compressed so as to enhance and the kinetic energy of the fluid therein and make it flow to the bilateral sides, and then transferred upwardly through the vacant space between the vibration plate 230 and the bracket 232. As the vibration plate 230 vibrates downwardly, the movable part 22a of the flexible plate 22 correspondingly moves downwardly and subjected to the downward curvy deformation because of the resonance of the vibration plate 230. Meanwhile, less fluid is converged to the convergence chamber in the central cavity 212 of the communication plate 21. Since the piezoelectric actuator 23 vibrates downwardly, the volume of the compressible chamber B is increased. Above-mentioned actions depicted in FIG. 3B are repeatedly done so as to expand or compress the compressible chamber B, thus enlarging the amount of inhalation or discharge of the fluid.

As mentioned above, the deformable substrate 20 is made by stacking and coupling the communication plate 21 and the flexible plate 22. The synchronously-deformed structure is defined by the communication plate 21 and the flexible plate 22 collaboratively. Specifically, the synchronously-deformed structure is defined by a synchronously-deformed region of the communication plate 21 and a synchronously-deformed region of the flexible plate 22 collaboratively. When one of the communication plate 21 and the flexible plate 22 is subjected to deformation, another is also subjected to deformation synchronously. Moreover, the deformation shape of the communication plate 21 and the deformation shape of the flexible plate 22 are identical. As a result, after the corresponding surfaces of the communication plate 21 and the flexible plate 22 are contacted with and positioned on each other, there is merely little interval or parallel offset happened therebetween.

As previously described, the piezoelectric actuator and the substrate of the conventional fluid control device are flat-plate structures with certain rigidities. Consequently, it is difficult to precisely align these two flat-plate structures and make them separated by the specified gap (i.e., maintain the specified depth). That is, the misalignment of the piezoelectric actuator and the substrate could readily occur. In accordance with the present invention, the synchronously-deformed structure of the deformable substrate 20 is defined in response to the synchronous deformation of the communication plate 21 and the flexible plate 22. Moreover, the function of the synchronously-deformed structure is similar to the function of the substrate of the conventional technology. More especially, the synchronously-deformed structure defined by the communication plate 21 and the flexible plate 22 has various implementation examples. In these implementation examples, a compressible chamber B corresponding to the specified depth δ (i.e., a specified gap between the synchronously-deformed structure and the vibration plate 230 of the piezoelectric actuator 23) is maintained according to the practical requirements. Consequently, the fluid control device 2 is developed toward miniaturization, and the miniature components are adopted. Due to the synchronously-deformed structure, it is easy to maintain the specified gap between the deformable substrate and the vibration plate. As previously described, the conventional technology has to precisely align two large-area flat-plate structures. In accordance with the feature of the present invention, the area to be aligned reduces because the deformable substrate 20 has the synchronously-deformed structure and is a non-flat-plate structure. The shape of the synchronously-deformed structure is not restricted. For example, the synchronously-deformed structure has a curvy shape, a conical shape, a curvy-surface profile or an irregular shape. Compared with aligning two large areas of the two flat plates, aligning one small area of a non-flat-plate with a flat plate is much easier, and therefore reduces assembling errors. Under this circumstance, the performance of transferring the fluid is enhanced and the noise is reduced.

Preferably but not exclusively, the synchronously-deformed structure has a curvy shape, a conical shape, a curvy-surface profile or an irregular shape. Some examples of the synchronously-deformed structure will be described as follows.

Figure 4A:
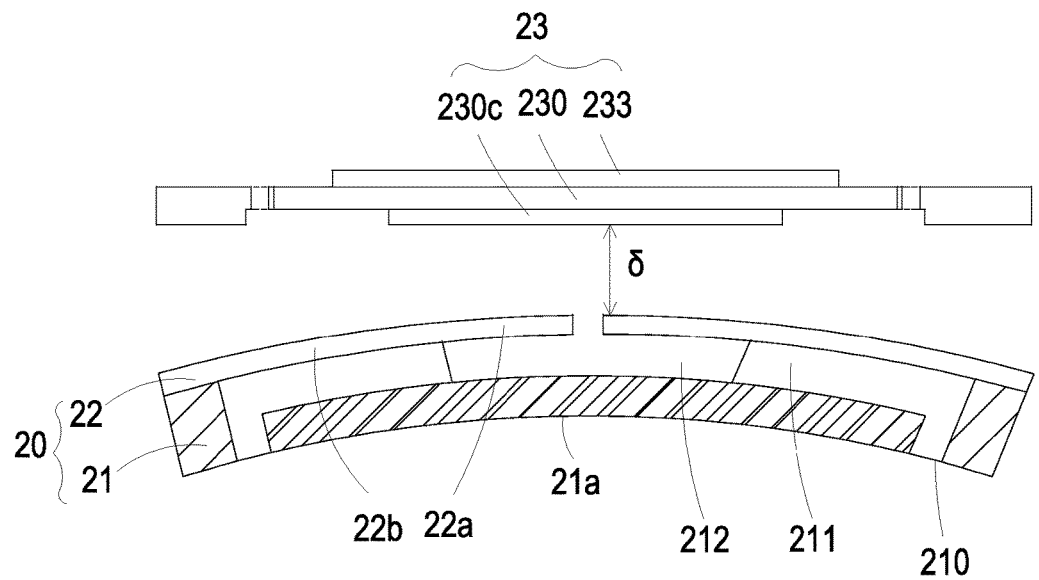
FIG. 4A is a schematic cross-sectional view illustrating a first example of the synchronously-deformed structure of the deformable substrate of the fluid control device.
Figure 4B:
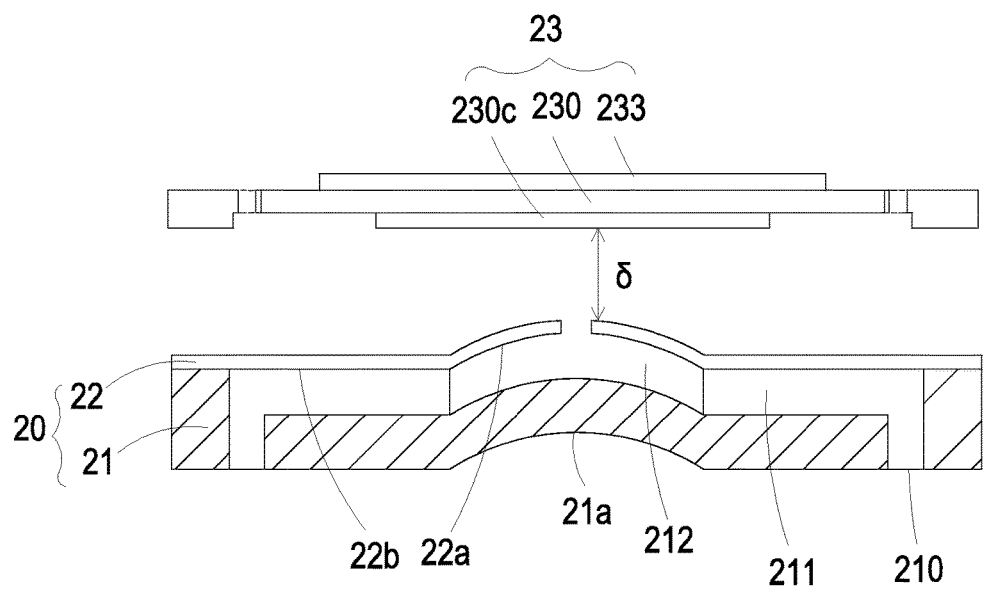
FIG. 4B is a schematic cross-sectional view illustrating a second example of the synchronously-deformed structure of the deformable substrate of the fluid control device.
Figure 4C:
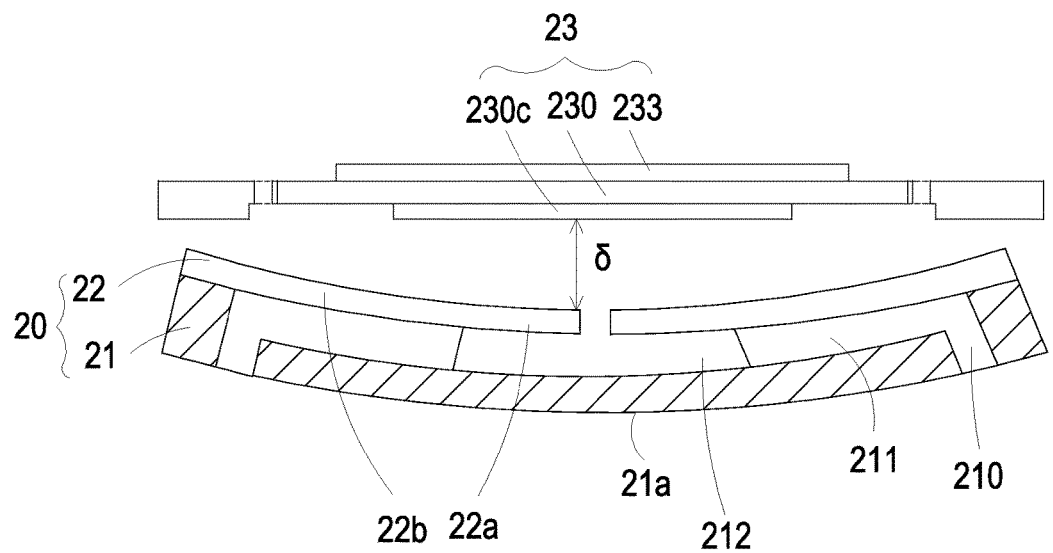
FIG. 4C is a schematic cross-sectional view illustrating a third example of the synchronously-deformed structure of the deformable substrate of the fluid control device.

Please refer to FIGS. 4A and 4C. FIG. 4A is a schematic cross-sectional view illustrating a first example of the synchronously-deformed structure of the deformable substrate of the fluid control device. FIG. 4C is a schematic cross-sectional view illustrating a third example of the synchronously-deformed structure of the deformable substrate of the fluid control device. In the examples of FIGS. 4A and 4C, the synchronously-deformed structure is defined by the entire communication plate 21 and the entire flexible plate 22 collaboratively. That is, the synchronously-deformed region of the flexible plate 22 includes the movable part 22a and the region beyond the movable part 22a. The deformation direction of the example of FIG. 4A and the deformation direction of the example of FIG. 4C are opposite. As shown in FIG. 4A, the outer surface 21a of the communication plate 21 of the deformable substrate 20 is bent in the direction toward the bulge 230c of the vibration plate 230. Moreover, the movable part 22a and the region beyond the movable part 22a of the flexible plate 22 are also bent in the direction toward the bulge 230c of the vibration plate 230. The bent communication plate 21 and the bent flexible plate 22 define the synchronously-deformed structure of the deformable substrate 20. As shown in FIG. 4C, the outer surface 21a of the communication plate 21 of the deformable substrate 20 is bent in the direction away from the bulge 230c of the vibration plate 230. Simultaneously, the movable part 22a and the region beyond the movable part 22a of the flexible plate 22 are also bent in the direction away from the bulge 230c of the vibration plate 230. As a consequence, the synchronously-deformed structure of the deformable substrate 20 is defined. Under this circumstance, the specified depth δ is defined and maintained between the movable part 22a of the flexible plate 22 and the bulge 230c of the vibration plate 230. Consequently, the fluid control device 2 with the synchronously-deformed structure is produced.

Figure 5A:
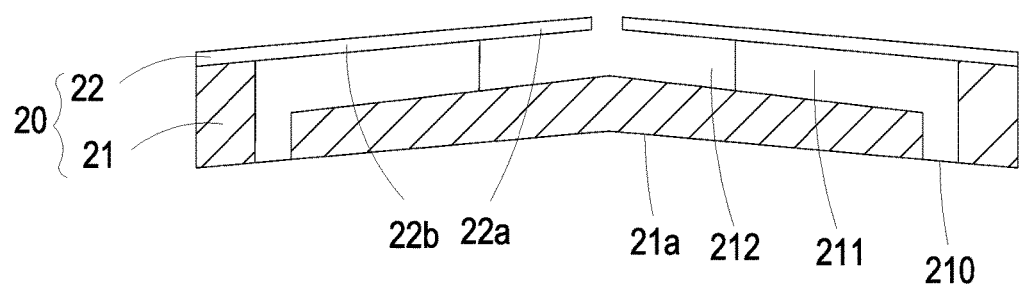
FIG. 5A is a schematic cross-sectional view illustrating a fifth example of the synchronously-deformed structure of the deformable substrate of the fluid control device.
Figure 5B:
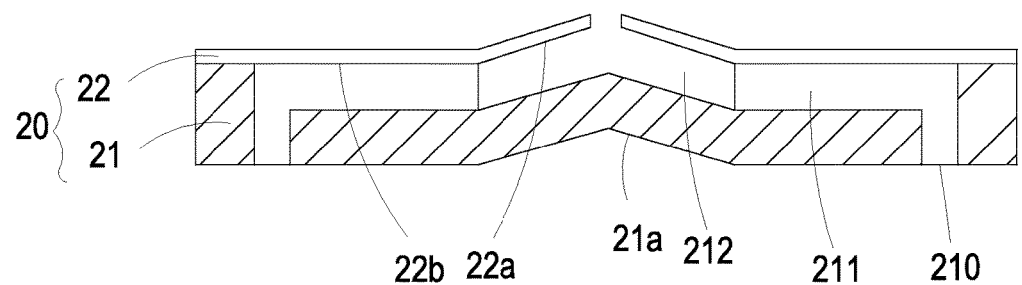
FIG. 5B is a schematic cross-sectional view illustrating a sixth example of the synchronously-deformed structure of the deformable substrate of the fluid control device.
Figure 5C:
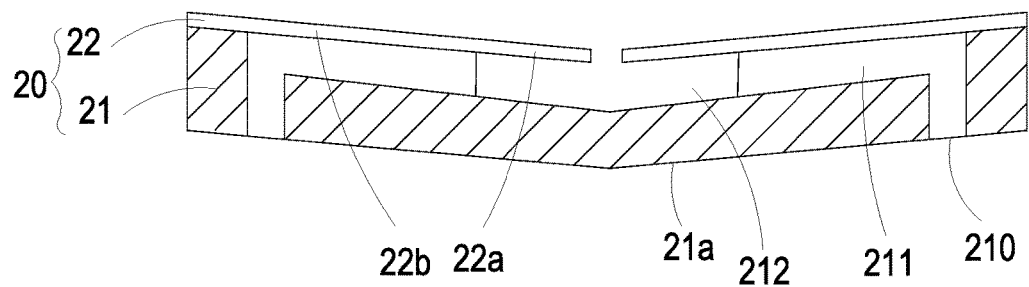
FIG. 5C is a schematic cross-sectional view illustrating a seventh example of the synchronously-deformed structure of the deformable substrate of the fluid control device

Please refer to FIGS. 5A and 5C. FIG. 5A is a schematic cross-sectional view illustrating a fifth example of the synchronously-deformed structure of the deformable substrate of the fluid control device. FIG. 5C is a schematic cross-sectional view illustrating a seventh example of the synchronously-deformed structure of the deformable substrate of the fluid control device. In the examples of FIGS. 5A and 5C, the synchronously-deformed structure is a conical synchronously-deformed structure that is defined by the entire communication plate 21 and the entire flexible plate 22 collaboratively. That is, the synchronously-deformed region of the flexible plate 22 includes the movable part 22a and the region beyond the movable part 22a of the flexible plate 22. The deformation direction of the example of FIG. 5A and the deformation direction of the example of FIG. 5C are opposite. As shown in FIG. 5A, the outer surface 21a of the communication plate 21 of the deformable substrate 20 is bent in the direction toward the bulge 230c of the vibration plate 230. Moreover, the movable part 22a and the region beyond the movable part 22a of the flexible plate 22 are also bent in the direction toward the bulge 230c of the vibration plate 230. As a consequence, the conical synchronously-deformed structure of the deformable substrate 20 is defined. As shown in FIG. 5C, the outer surface 21a of the communication plate 21 of the deformable substrate 20 is bent in the direction away from the bulge 230c of the vibration plate 230. Moreover, the movable part 22a and the region beyond the movable part 22a of the flexible plate 22 are also bent in the direction away from the bulge 230c of the vibration plate 230. As a consequence, the conical synchronously-deformed structure of the deformable substrate 20 is defined. Under this circumstance, the specified depth δ is defined and maintained between the movable part 22a of the flexible plate 22 and the bulge 230c of the vibration plate 230. Consequently, the fluid control device 2 with the conical synchronously-deformed structure is produced.

Figure 6A:
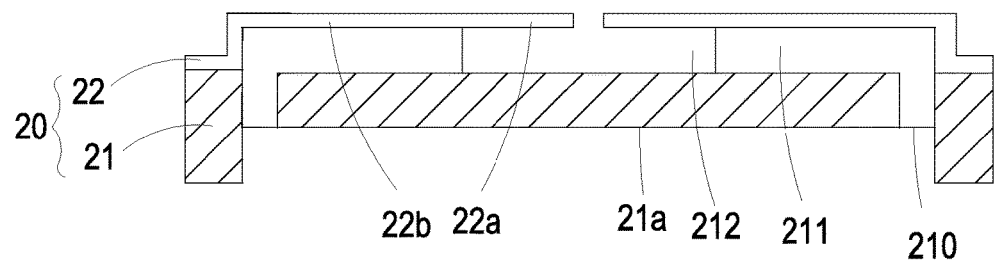
FIG. 6A is a schematic cross-sectional view illustrating a ninth example of the synchronously-deformed structure of the deformable substrate of the fluid control device.
Figure 6B:
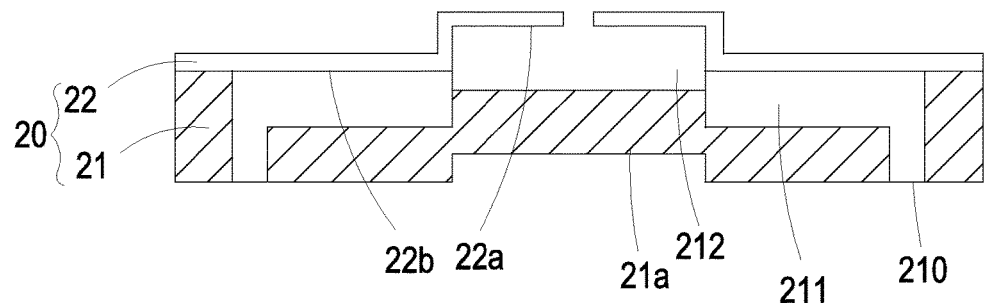
FIG. 6B is a schematic cross-sectional view illustrating a tenth example of the synchronously-deformed structure of the deformable substrate of the fluid control device.
Figure 6C:
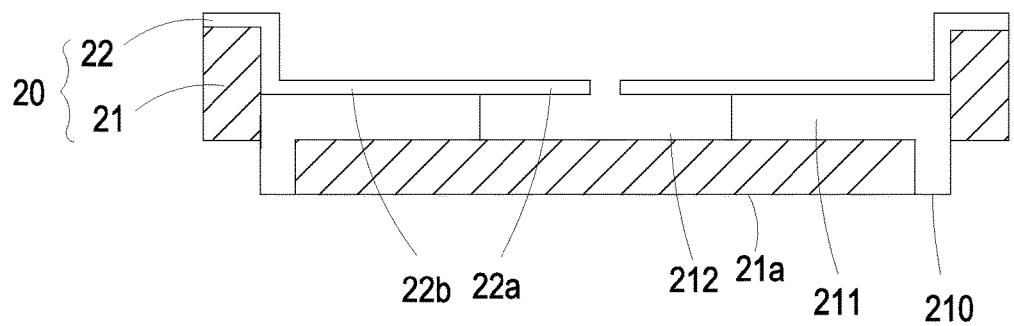
FIG. 6C is a schematic cross-sectional view illustrating an eleventh example of the synchronously-deformed structure of the deformable substrate of the fluid control device.

Please refer to FIGS. 6A and 6C. FIG. 6A is a schematic cross-sectional view illustrating a ninth example of the synchronously-deformed structure of the deformable substrate of the fluid control device. FIG. 6C is a schematic cross-sectional view illustrating an eleventh example of the synchronously-deformed structure of the deformable substrate of the fluid control device. In the examples of FIGS. 6A and 6C, the synchronously-deformed structure is a convex synchronously-deformed structure that is defined by the entire communication plate 21 and the entire flexible plate 22 collaboratively. That is, the convex synchronously-deformed region of flexible plate 22 of the deformable substrate 20 includes the movable part 22a and the region beyond the movable part 22a. The deformation direction of the example of FIG. 6A and the deformation direction of the example of FIG. 6C are opposite. As shown in FIG. 6A, the outer surface 21a of the communication plate 21 of the deformable substrate 20 is bent in the direction toward the bulge 230c of the vibration plate 230. Moreover, the movable part 22a and the region beyond the movable part 22a of the flexible plate 22 are also bent in the direction toward the bulge 230c of the vibration plate 230. As a consequence, the convex synchronously-deformed structure of the deformable substrate 20 is defined. As shown in FIG. 6C, the outer surface 21a of the communication plate 21 of the deformable substrate 20 is bent in the direction away from the bulge 230c of the vibration plate 230. Moreover, the movable part 22a and the region beyond the movable part 22a of the flexible plate 22 are also bent in the direction away from the bulge 230c of the vibration plate 230. As a consequence, the convex synchronously-deformed structure of the deformable substrate 20 is defined. Under this circumstance, the specified depth δ is defined and maintained between the movable part 22a of the flexible plate 22 and the bulge 230c of the vibration plate 230. Consequently, the fluid control device 2 with the convex synchronously-deformed structure is produced.

Alternatively, the synchronously-deformed structure is defined by a part of the communication plate 21 and a part of the flexible plate 22 collaboratively. That is, the synchronously-deformed region of the flexible plate 22 of the deformable substrate 20 includes the region of the movable part 22a only, and the scale of the synchronously-deformed region of the communication plate 21 corresponds to the synchronously-deformed region of the flexible plate 22. In addition, the synchronously-deformed structure of the deformable substrate 20 includes but not limited to a curvy structure, a conical structure and a convex structure.

Figure 4D:
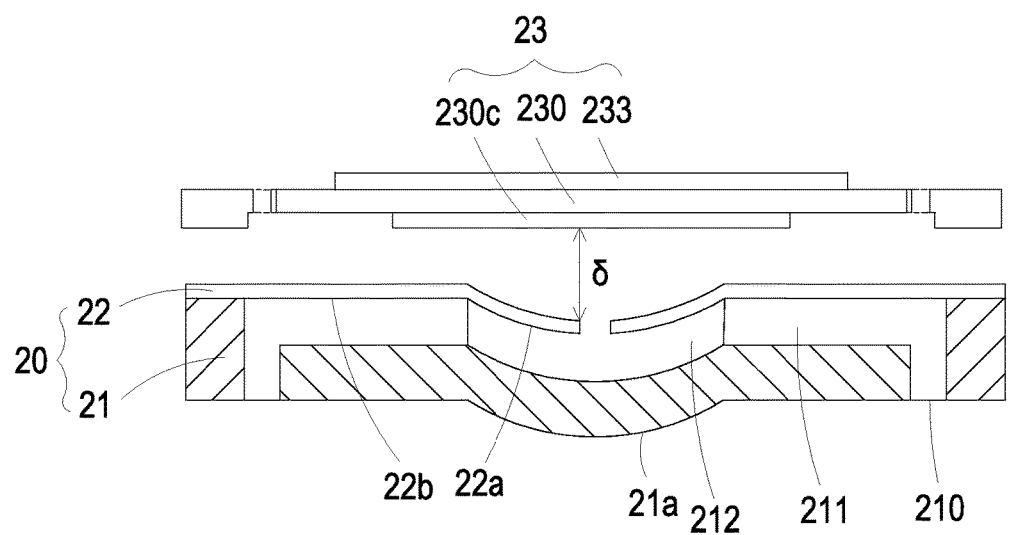
FIG. 4D is a schematic cross-sectional view illustrating a fourth example of the synchronously-deformed structure of the deformable substrate of the fluid control device.

Please refer to FIGS. 4B and 4D. FIG. 4B is a schematic cross-sectional view illustrating a second example of the synchronously-deformed structure of the deformable substrate of the fluid control device. FIG. 4D is a schematic cross-sectional view illustrating a fourth example of the synchronously-deformed structure of the deformable substrate of the fluid control device. In the examples of FIGS. 4B and 4D, the synchronously-deformed structure is defined by a part of the communication plate 21 and a part of the flexible plate 22 collaboratively. The synchronously-deformed region of the flexible plate 22 includes the region of the movable part 22a only, and the synchronously-deformed region of the communication plate 21 corresponds to the synchronously-deformed region of the flexible plate 22. That is, the synchronously-deformed structures of FIGS. 4B and 4D are produced by partially deforming the deformable substrate 20. The deformation direction of the example of FIG. 4B and the deformation direction of the example of FIG. 4D are opposite. As shown in FIG. 4B, the outer surface 21a of the communication plate 21 of the deformable substrate 20 is partially bent in the direction toward the bulge 230c of the vibration plate 230. Moreover, the region of the movable part 22a of the flexible plate 22 is also partially bent in the direction toward the bulge 230c of the vibration plate 230. As a consequence, the partially-bent synchronously-deformed structure of the deformable substrate 20 is defined. As shown in FIG. 4D, the outer surface 21a of the communication plate 21 of the deformable substrate 20 is partially bent in the direction away from the bulge 230c of the vibration plate 230. Moreover, the region of the movable part 22a of the flexible plate 22 is also partially bent in the direction away from the bulge 230c of the vibration plate 230. As a consequence, the partially-bent synchronously-deformed structure of the deformable substrate 20 is defined. Under this circumstance, the specified depth δ is defined and maintained between the movable part 22a of the flexible plate 22 and the bulge 230c of the vibration plate 230. That is, the specified depth δ between the movable part 22a of the flexible plate 22 and the bulge 230c of the vibration plate 230 is maintained. Consequently, the fluid control device 2 with the partially-bent synchronously-deformed structure is produced.

Figure 5D:
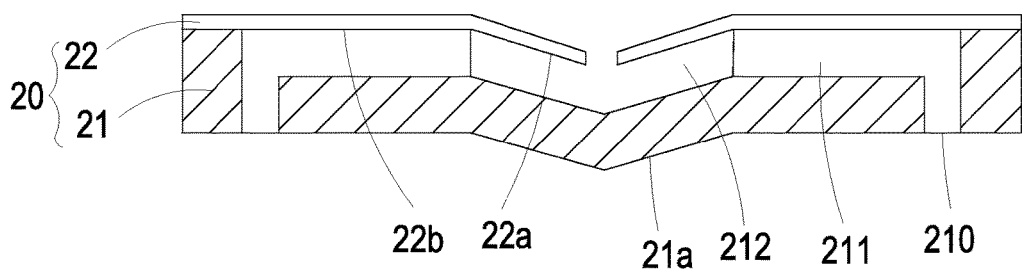
FIG. 5D is a schematic cross-sectional view illustrating an eighth example of the synchronously-deformed structure of the deformable substrate of the fluid control device.

Please refer to FIGS. 5B and 5D. FIG. 5B is a schematic cross-sectional view illustrating a sixth example of the synchronously-deformed structure of the deformable substrate of the fluid control device. FIG. 5D is a schematic cross-sectional view illustrating an eighth example of the synchronously-deformed structure of the deformable substrate of the fluid control device. In the examples of FIGS. 5B and 5D, the synchronously-deformed structure is defined by a part of the communication plate 21 and a part of the flexible plate 22 collaboratively. The synchronously-deformed region of the flexible plate 22 includes the region of the movable part 22a only, and the synchronously-deformed region of the communication plate 21 corresponds to the synchronously-deformed region of the flexible plate 22. That is, the synchronously-deformed structures of FIGS. 5B and 5D are produced by partially deforming the deformable substrates 20 to conical synchronously-deformed structures. The deformation direction of the example of FIG. 5B and the deformation direction of the example of FIG. 5D are opposite. As shown in FIG. 5B, the outer surface 21a of the communication plate 21 of the deformable substrate 20 is partially bent in the direction toward the bulge 230c of the vibration plate 230. Moreover, the region of the movable part 22a of the flexible plate 22 is also partially bent in the direction toward the bulge 230c of the vibration plate 230. As a consequence, the conical synchronously-deformed structure of the deformable substrate 20 is defined. As shown in FIG. 5D, the outer surface 21a of the communication plate 21 of the deformable substrate 20 is partially bent in the direction away from the bulge 230c of the vibration plate 230. Moreover, the region of the movable part 22a of the flexible plate 22 is also partially bent in the direction away from the bulge 230c of the vibration plate 230. As a consequence, the conical synchronously-deformed structure of the deformable substrate 20 is defined. Under this circumstance, the specified depth δ is defined and maintained between the movable part 22a of the flexible plate 22 and the bulge 230c of the vibration plate 230. Consequently, the fluid control device 2 with the conical synchronously-deformed structure is produced.

Figure 6D:
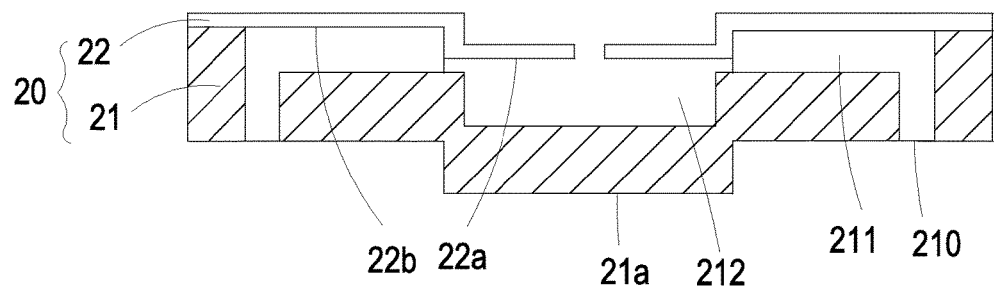
FIG. 6D is a schematic cross-sectional view illustrating a twelfth example of the synchronously-deformed structure of the deformable substrate of the fluid control device.

Please refer to FIGS. 6B and 6D. FIG. 6B is a schematic cross-sectional view illustrating a tenth example of the synchronously-deformed structure of the deformable substrate of the fluid control device. FIG. 6D is a schematic cross-sectional view illustrating a twelfth example of the synchronously-deformed structure of the deformable substrate of the fluid control device. In the examples of FIGS. 6B and 6D, the synchronously-deformed structure is defined by a part of the communication plate 21 and a part of the flexible plate 22 collaboratively. The synchronously-deformed region of the flexible plate 22 includes the region of the movable part 22a only, and the synchronously-deformed region of the communication plate 21 corresponds to the synchronously-deformed region of the flexible plate 22. That is, the synchronously-deformed structures of FIGS. 6B and 6D are produced by partially deforming the deformable substrates 20 to the convex synchronously-deformed structures. The deformation direction of the example of FIG. 6B and the deformation direction of the example of FIG. 6D are opposite. As shown in FIG. 6B, the outer surface 21a of the communication plate 21 of the deformable substrate 20 is partially bent in the direction toward the bulge 230c of the vibration plate 230. Moreover, the region of the movable part 22a of the flexible plate 22 is also partially bent in the direction toward the bulge 230c of the vibration plate 230. As a consequence, the convex synchronously-deformed structure of the deformable substrate 20 is defined. As shown in FIG. 6D, the outer surface 21a of the communication plate 21 of the deformable substrate 20 is partially bent in the direction away from the bulge 230c of the vibration plate 230. Moreover, the region of the movable part 22a of the flexible plate 22 is also partially bent in the direction away from the bulge 230c of the vibration plate 230. As a consequence, the convex synchronously-deformed structure of the deformable substrate 20 is defined. Under this circumstance, the specified depth δ is defined and maintained between the movable part 22a of the flexible plate 22 and the bulge 230c of the vibration plate 230. Consequently, the fluid control device 2 with the convex synchronously-deformed structure is produced.

Figure 7:
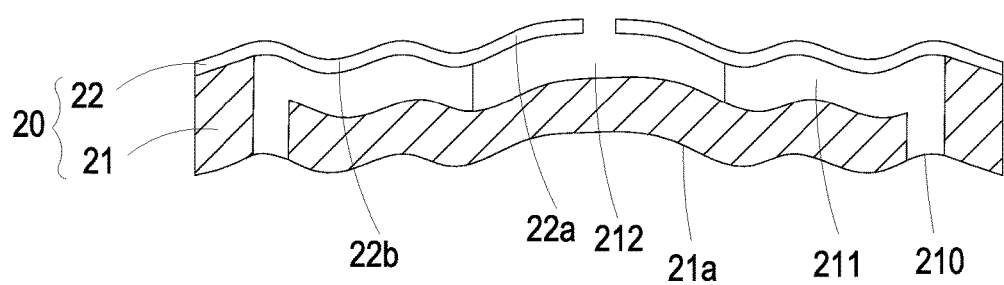
FIG. 7 is a schematic cross-sectional view illustrating a thirteenth example of the synchronously-deformed structure of the deformable substrate of the fluid control device.

FIG. 7 is a schematic cross-sectional view illustrating an example of the synchronously-deformed structure of the deformable substrate of the fluid control device. The synchronously-deformed structure also can be a curvy-surface synchronously-deformed structure, which is composed of plural curvy surfaces with different or identical curvatures. As shown in FIG. 7, the curvy-surface synchronously-deformed structure comprises plural curvy surfaces with different curvatures. A set of the plural curvy surfaces are formed on the outer surface 21a of the communication plate 21 of the deformable substrate 20, while another set of curvy surfaces corresponding to the former set are formed on the flexible plate 22. Under this circumstance, the specified depth δ is defined and maintained between the curvy-surface synchronously-deformed structure and the bulge 230c of the vibration plate 230. Consequently, the fluid control device 2 with the curvy-surface synchronously-deformed structure is produced.

In some other embodiments, the synchronously-deformed structure is an irregular synchronously-deformed structure, which is produced by making two sets of identical irregular surfaces respectively on the communication plate 21 and the flexible plate 22 of the deformable substrate 20. Consequently, the irregular synchronously-deformed structure is defined by the communication plate 21 and the flexible plate 22. The synchronously-deformed structure is bent in the direction toward or away the bulge 230c of the vibration plate 230. Under this circumstance, the specified depth δ is defined and maintained between the synchronously-deformed structure and the bulge 230c of the vibration plate 230.

It is noted that numerous modifications and alterations may be made while retaining the teachings of the invention. For example, the deformable substrate 20 may be varied according to the practical requirements.

In the above embodiments, the fluid control device comprises the deformable substrate 20. The specified depth δ is defined and maintained between the movable part 22a of the flexible plate 22 and the bulge 230c of the vibration plate 230. Due to the specified depth δ, the gap can be retained in an adequate range that is not too large to cause inefficiency of fluid transmission, and not too small to cause the contact interference between the flexible plate 22 and the piezoelectric actuator 23. That is, assembling errors of the fluid control device 2 reduces. Consequently, the efficiency of transferring the fluid is enhanced, and the noise is diminished.

From the above descriptions, the present invention provides a fluid control device. After the housing, the piezoelectric actuator and the deformable substrate are stacked and combined together, a synchronous deformation process is implemented by applying at least one external force to an outer portion of the deformation substrate. Consequently, the flexible plate and communication plate of the deformable substrate are subjected to synchronous deformation, and a specified depth between the movable part of the flexible plate and the bulge of the vibration plate is defined. The specified depth between the movable part of the flexible plate and the bulge of the vibration plate can be adjusted to a required range, and the specified depth is sufficient to reduce the contact interference between the flexible plate and the piezoelectric actuator. Consequently, the efficiency of transferring the fluid is enhanced, and the noise is reduced. Since the specified depth is advantageous for increasing the efficiency of transferring the fluid and reducing the noise, the product yield is increased and the quality of the fluid control device is significantly enhanced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of a fluid control device, comprising:
    (a) providing a housing, a piezoelectric actuator and a deformable substrate, wherein the piezoelectric actuator comprises a piezoelectric element and a vibration plate, and the deformable substrate comprises a flexible plate and a communication plate, wherein the vibration plate has a first surface and an opposing second surface, a bulge is formed on the second surface of the vibration plate, the communication plate has an outer surface, and the flexible plate comprises a movable part;
    (b) stacking and coupling the flexible plate and the communication plate to form the deformable substrate; and
    (c) coupling the housing, the piezoelectric actuator and the deformable substrate which are sequentially stacked, applying at least one external force thereon to implement a synchronous deformation process, so that the flexible plate and the communication plate of the deformable substrate are subjected to a synchronous deformation, and a specified depth is defined between the movable part of the flexible plate and the bulge of the vibration plate,
    wherein a synchronously-deformed region of the deformable substrate includes the movable part, the deformable substrate is a conical synchronously-deformed structure, and the specified depth is defined between the conical synchronously-deformed structure and the bulge of the vibration plate.

2. The manufacturing method according to claim 1, wherein the at least one external force is applied to the outer surface of the communication plate, so that the deformable substrate is subjected to the synchronous deformation.

3. The manufacturing method according to claim 2, wherein the at least one external force is applied to the outer surface of the communication plate and in a direction toward the flexible plate, so that the deformable substrate is subjected to the synchronous deformation, and a mark is formed on the outer surface of the communication plate by the at least one external force.

4. The manufacturing method according to claim 2, wherein the at least one external force is applied to the outer surface of the communication plate and in a direction away from the flexible plate, so that the deformable substrate is subjected to the synchronous deformation, and a mark is formed on the outer surface of the communication plate by the at least one external force.

5. The manufacturing method according to claim 2, wherein an operation gap is formed between the at least one external force and the outer surface of the communication plate, and the at least one external force is in a direction away from the flexible plate so that the deformable substrate is subjected to the synchronous deformation, and a mark is formed on the outer surface of the communication plate by the at least one external force.

6. The manufacturing method according to claim 5, wherein the at least one external force is a suction force or a magnetic attraction force.

7. The manufacturing method according to claim 1, wherein the synchronously-deformed region of the deformable substrate includes a region beyond the movable part of the flexible plate.

8. The manufacturing method according to claim 1, wherein the vibration plate of the piezoelectric actuator has a square shape, and the piezoelectric actuator further comprises: an outer frame arranged around the vibration plate; and at least one bracket connected between the vibration plate and the outer frame for elastically supporting the vibration plate.

9. The manufacturing method according to claim 1, wherein the deformable substrate and the vibration plate are connected with each other through a medium, and the medium is an adhesive.

10. A manufacturing method of a fluid control device, comprising:
   (a) providing a housing, a piezoelectric actuator and a deformable substrate, wherein the piezoelectric actuator comprises a piezoelectric element and a vibration plate, and the deformable substrate comprises a flexible plate and a communication plate, wherein the vibration plate has a first surface and an opposing second surface, a bulge is formed on the second surface of the vibration plate, the communication plate has an outer surface, and the flexible plate comprises a movable part;
   (b) stacking and coupling the flexible plate and the communication plate to form the deformable substrate; and
   (c) coupling the housing, the piezoelectric actuator and the deformable substrate which are sequentially stacked, applying at least one external force thereon to implement a synchronous deformation process, so that the flexible plate and the communication plate of the deformable substrate are subjected to a synchronous deformation, and a specified depth is defined between the movable part of the flexible plate and the bulge of the vibration plate,
   wherein the deformable substrate is a curvy-surface synchronously-deformed structure composed of the communication plate and the flexible plate, the curvy-surface synchronously-deformed structure comprises plural curvy surfaces with an identical curvature or different curvatures, and the specified depth is defined between the curvy-surface synchronously-deformed structure and the bulge of the vibration plate.

11. A manufacturing method of a fluid control device, comprising:
   (a) providing a housing, a piezoelectric actuator and a deformable substrate, wherein the piezoelectric actuator comprises a piezoelectric element and a vibration plate, and the deformable substrate comprises a flexible plate and a communication plate, wherein the vibration plate has a first surface and an opposing second surface, a bulge is formed on the second surface of the vibration plate, the communication plate has an outer surface, and the flexible plate comprises a movable part;
   (b) stacking and coupling the flexible plate and the communication plate to form the deformable substrate; and
   (c) coupling the housing, the piezoelectric actuator and the deformable substrate which are sequentially stacked, applying at least one external force thereon to implement a synchronous deformation process, so that the flexible plate and the communication plate of the deformable substrate are subjected to a synchronous deformation, and a specified depth is defined between the movable part of the flexible plate and the bulge of the vibration plate,
   wherein the deformable substrate is an irregular synchronously-deformed structure composed of the communication plate and the flexible plate, and the specified depth is defined between the irregular synchronously-deformed structure and the bulge of the vibration plate.

* * * * *